(12) United States Patent
Banhegyesi

(10) Patent No.: US 8,717,007 B2
(45) Date of Patent: May 6, 2014

(54) INTELLIGENT ELECTRONIC DEVICE HAVING A TERMINAL ASSEMBLY FOR COUPLING TO A METER MOUNTING SOCKET

(75) Inventor: Tibor Banhegyesi, Baldwin, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 580 days.

(21) Appl. No.: 12/578,062

(22) Filed: Oct. 13, 2009

(65) Prior Publication Data
US 2010/0090680 A1  Apr. 15, 2010

Related U.S. Application Data

(60) Provisional application No. 61/104,355, filed on Oct. 10, 2008.

(51) Int. Cl.
*G01R 1/00* (2006.01)

(52) U.S. Cl.
USPC ........ 324/110; 324/156; 324/142; 324/76.11; 324/74; 361/659; 361/668; 439/517

(58) Field of Classification Search
CPC .... H01R 13/1447; H02B 1/00; G01R 22/065; G01R 35/04; G01R 11/32; G01R 21/006
USPC ......... 324/142, 156, 110, 76.11, 74; 361/659, 361/668; 439/517
See application file for complete search history.

(56) References Cited

U.S. PATENT DOCUMENTS

| | | |
|---|---|---|
| 2,105,396 A | 1/1938 | Bakke |
| 2,902,629 A | 9/1959 | Little |
| 3,002,481 A | 10/1961 | Hutters |
| 3,355,630 A | 11/1967 | Orr |
| 3,391,384 A | 7/1968 | Hughes |
| 3,541,225 A | 11/1970 | Raciti |
| 3,780,433 A | 12/1973 | Lynch |
| 3,796,953 A | 3/1974 | Zisa et al. |

(Continued)

FOREIGN PATENT DOCUMENTS

| | | |
|---|---|---|
| CA | 2299044 | 2/2001 |
| DE | 3636817 | 5/1988 |

(Continued)

OTHER PUBLICATIONS

Clark, Raymond H.; Printed Circuit Engineering: Optimizing for Manufacturability, 1989, pp. 34-35, 38-40, 163.

(Continued)

*Primary Examiner* — Tung X Nguyen
(74) *Attorney, Agent, or Firm* — Michael J. Porco; Gerald E. Hespos; Matthew T. Hespos

(57) ABSTRACT

An intelligent electronic device having a terminal assembly for coupling the IED, e.g., a revenue meter, to a meter mounting socket. The assembly includes a housing including a generally planar, rigid base, the base including at least one opening and at least one circuit board having at least one electrically conducting terminal surface mounted thereon, the at least one electrically conducting terminal extending through the at least one opening of the base to mate with at least one matching jaw of a detachable meter mounting device coupled to the electrical circuit.

43 Claims, 10 Drawing Sheets

(56) References Cited

U.S. PATENT DOCUMENTS

| | | | |
|---|---|---|---|
| 3,880,494 A * | 4/1975 | Reed et al. .................... 439/517 |
| 3,915,546 A | 10/1975 | Cobaugh |
| 3,943,413 A | 3/1976 | Keever |
| 3,991,347 A | 11/1976 | Hollyday |
| 4,034,290 A | 7/1977 | Warren |
| 4,050,621 A | 9/1977 | Bouley |
| 4,072,385 A | 2/1978 | Wallner |
| 4,092,592 A | 5/1978 | Milkovic |
| 4,121,147 A | 10/1978 | Becker et al. |
| 4,259,746 A | 3/1981 | Sandstedt |
| 4,264,960 A | 4/1981 | Gurr |
| 4,298,839 A | 11/1981 | Johnston |
| 4,393,438 A | 7/1983 | Schelhorn |
| 4,400,783 A | 8/1983 | Locke, Jr. et al. |
| 4,455,612 A | 6/1984 | Girgis |
| 4,477,970 A | 10/1984 | Alexander |
| 4,542,469 A | 9/1985 | Brandyberry et al. |
| 4,571,691 A | 2/1986 | Kennon |
| 4,592,137 A | 6/1986 | Tanaka |
| 4,744,004 A | 5/1988 | Hammond |
| 4,791,362 A | 12/1988 | Philpot |
| 4,839,819 A | 6/1989 | Begin et al. |
| 4,843,311 A | 6/1989 | Rozman et al. |
| 4,851,614 A | 7/1989 | Duncan, Jr. |
| 4,886,981 A | 12/1989 | Lentini |
| 4,959,607 A | 9/1990 | Coryea et al. |
| 5,012,301 A | 4/1991 | Xu |
| 5,021,763 A | 6/1991 | Obear |
| 5,207,595 A | 5/1993 | Learmont et al. |
| 5,229,713 A | 7/1993 | Bullock et al. |
| 5,233,131 A | 8/1993 | Liang |
| 5,271,548 A | 12/1993 | Maiwald |
| 5,326,937 A | 7/1994 | Watanabe |
| 5,345,225 A * | 9/1994 | Davis ........................... 340/635 |
| 5,364,290 A | 11/1994 | Hartman |
| 5,385,486 A | 1/1995 | Robinson |
| 5,390,078 A | 2/1995 | Taylor |
| 5,402,314 A | 3/1995 | Amago |
| 5,412,166 A | 5/1995 | Krupp |
| 5,414,223 A | 5/1995 | Suski |
| 5,514,953 A | 5/1996 | Schultz |
| 5,514,959 A | 5/1996 | Horan et al. |
| 5,530,846 A | 6/1996 | Strong |
| 5,539,304 A | 7/1996 | Payne |
| 5,548,209 A | 8/1996 | Lusignan et al. |
| 5,556,308 A | 9/1996 | Brown |
| 5,567,181 A | 10/1996 | Lentz |
| 5,571,031 A | 11/1996 | Robinson et al. |
| 5,600,526 A | 2/1997 | Russell et al. |
| 5,620,337 A | 4/1997 | Pruehs |
| 5,646,373 A | 7/1997 | Collins et al. |
| 5,650,936 A | 7/1997 | Loucks et al. |
| 5,661,623 A | 8/1997 | McDonald |
| 5,704,535 A | 1/1998 | Thompson, Sr. |
| 5,715,438 A | 2/1998 | Silha |
| 5,742,512 A | 4/1998 | Edge et al. |
| 5,745,114 A | 4/1998 | King et al. |
| 5,774,336 A | 6/1998 | Larson |
| 5,834,932 A | 11/1998 | May |
| 5,861,742 A | 1/1999 | Miller |
| 5,862,391 A | 1/1999 | Salas et al. |
| 5,930,117 A | 7/1999 | Gengel |
| 5,933,004 A | 8/1999 | Jackson |
| 5,958,060 A | 9/1999 | Premerlani |
| 5,973,481 A | 10/1999 | Thompson |
| 5,995,911 A | 11/1999 | Hart |
| 5,997,347 A * | 12/1999 | Robinson et al. ............. 439/517 |
| 6,000,034 A | 12/1999 | Lightbody et al. |
| 6,008,711 A | 12/1999 | Bolam |
| 6,015,314 A | 1/2000 | Benfante |
| 6,018,700 A | 1/2000 | Edel |
| 6,043,642 A | 3/2000 | Martin et al. |
| 6,043,986 A | 3/2000 | Kondo |
| 6,049,791 A | 4/2000 | Lerner |
| 6,124,806 A | 9/2000 | Cunningham et al. |
| 6,177,884 B1 | 1/2001 | Hunt et al. |
| 6,186,842 B1 * | 2/2001 | Hirschbold et al. .......... 439/876 |
| 6,236,949 B1 | 5/2001 | Hart |
| 6,271,523 B1 | 8/2001 | Weaver et al. |
| 6,304,517 B1 | 10/2001 | Ledfelt |
| 6,316,932 B1 | 11/2001 | Horan et al. |
| 6,429,785 B1 | 8/2002 | Griffin et al. |
| 6,555,997 B1 | 4/2003 | De Vries et al. |
| 6,561,844 B1 | 5/2003 | Johnson |
| 6,563,705 B1 | 5/2003 | Kuo |
| 6,615,147 B1 | 9/2003 | Jonker et al. |
| 6,657,424 B1 * | 12/2003 | Voisine et al. ............. 324/76.11 |
| 6,734,633 B2 | 5/2004 | Matsuba et al. |
| 6,734,663 B2 | 5/2004 | Fye et al. |
| 6,824,391 B2 | 11/2004 | Mickievicz et al. |
| 6,836,108 B1 * | 12/2004 | Balko et al. .................... 324/142 |
| 6,838,955 B1 | 1/2005 | Compton |
| 6,885,185 B1 * | 4/2005 | Makinson et al. ............. 324/142 |
| 6,972,555 B2 * | 12/2005 | Balko et al. .................... 324/142 |
| 6,982,490 B1 | 1/2006 | Dewey |
| 6,982,651 B2 * | 1/2006 | Fischer .................... 340/870.02 |
| 6,983,211 B2 | 1/2006 | Macfarlene et al. |
| 7,265,532 B2 | 9/2007 | Karanam et al. |
| 7,274,187 B2 | 9/2007 | Loy |
| 7,962,298 B2 | 6/2011 | Przydatek et al. |
| 8,177,580 B2 * | 5/2012 | Feldman et al. ............. 439/517 |
| 2008/0238713 A1 | 10/2008 | Banhegyesi et al. |
| 2010/0036830 A1 * | 2/2010 | Lee .................................. 707/5 |

FOREIGN PATENT DOCUMENTS

| | | |
|---|---|---|
| JP | 6-21603 | 1/1994 |
| JP | 6-61630 | 3/1994 |
| JP | 08-34263 | 2/1996 |
| WO | WO0101079 | 1/2001 |

OTHER PUBLICATIONS

Ge Ku2 tm Malfunction Meter, Product Description, Operating Instructions, Maintenance Instructions, Upgrading, Site Analysis Guides, Diagrams, pp. 1-1-2-32, Dec. 2000.

Hwang, Jennie S.; Modern Solder Technology for Competitive Electronics Manufacturing (1996).

Judd, Mike & Brindley, Keith; Soldering in Electronics Assembling (1992).

Lambert, Leo P.; Soldering for Electronic Assemblies (1988).

Lau, John H.; Solder Joint Reliability: Theory and Applications (1991).

Manko, Howard H.; Soldering Handbook for Printed Circuits and Surface Mounting (2nd ed. 1995).

Manko, Howard H.; Solders and Soldering (2d ed. 1979).

Quantum (R) Q1000 "Sandy Creek Plant Lonworks (R) Communication" brochure, (c) Copyright 1997 Schlumberger Industries, Inc., MK/1662/9-97, pp. 1-4.

Rahn, Armin; The Basics of Soldering (1993).

Schlumberger Electricity "One of your largest customers is concerned about power quality . . ." brochure, (c) Copyright 1996 Schlumberger Industries, Inc., pp. 1633/6-96m pp. 1-5.

Singman, Andrew; Modern Electronics Soldering Techniques (2000).

Smith, H. Ted; Quality Hand Soldering and Circuit Board Repair (1994).

Schlumberger "Quantum (R) Q100 Multimeasurement Meter Technical Reference Guide," Effective Oct. 1999, (c) Copyright 1999, Schlumberger Resource Management Services, Inc.

* cited by examiner

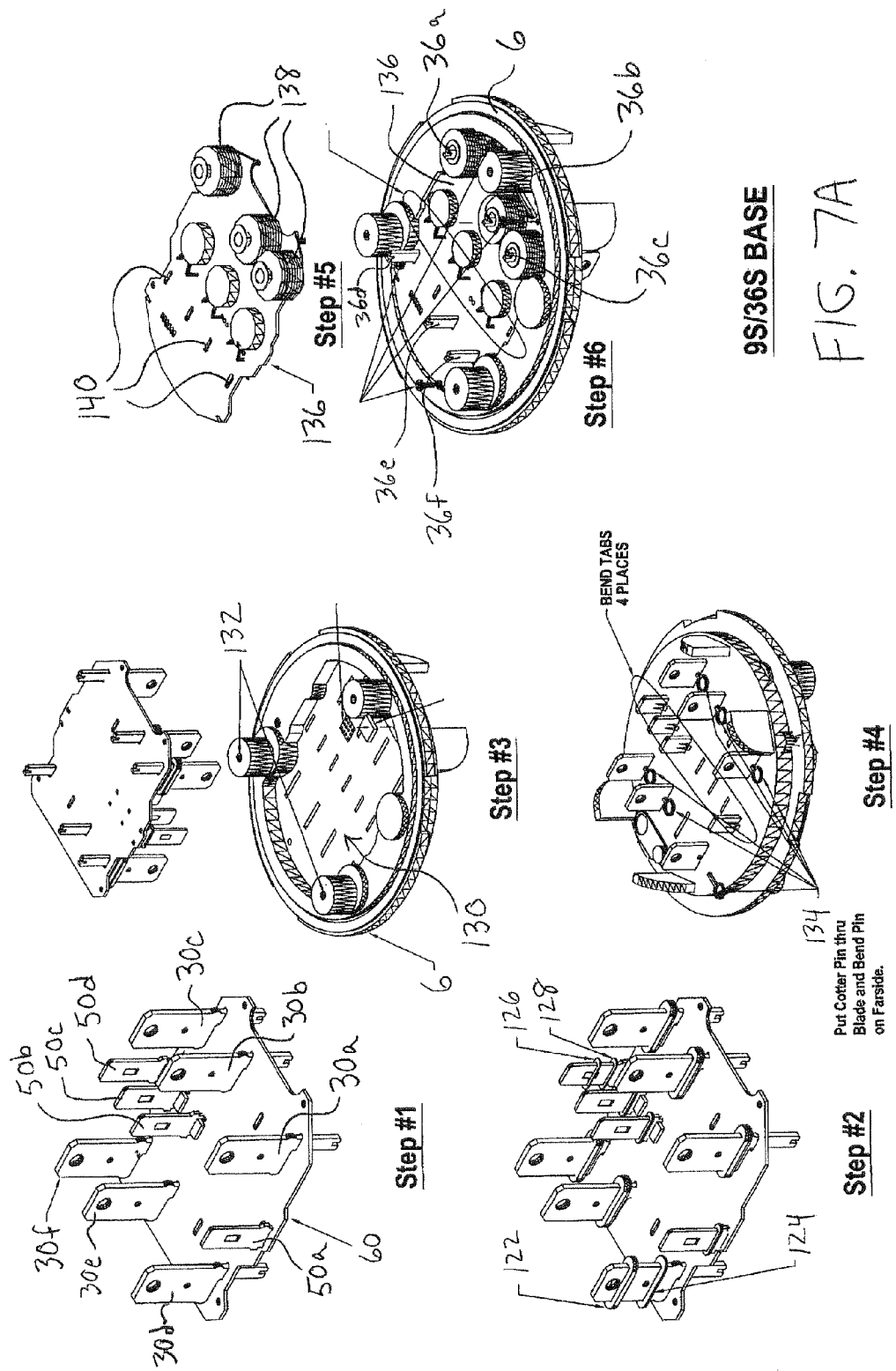

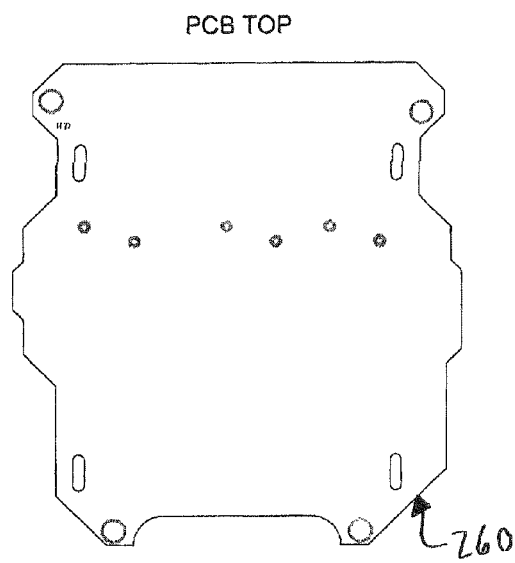
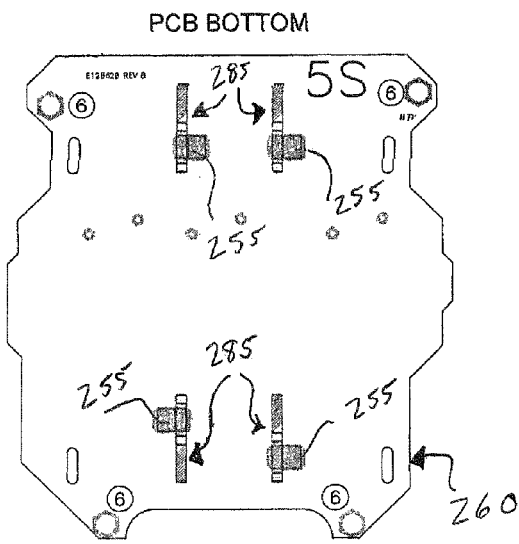
FIG. 8A  FIG. 8B
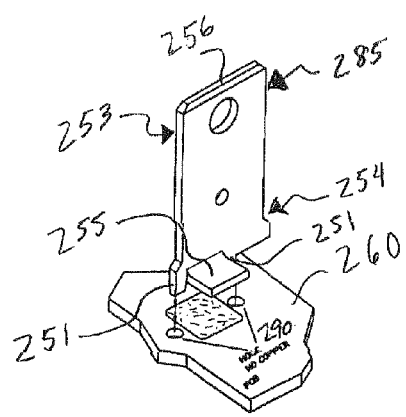
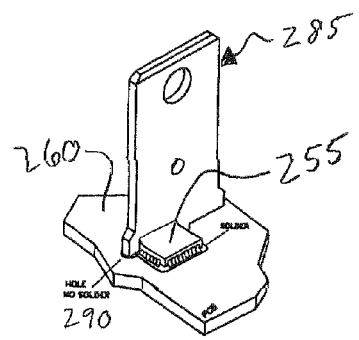
FIG. 8C  FIG. 8D

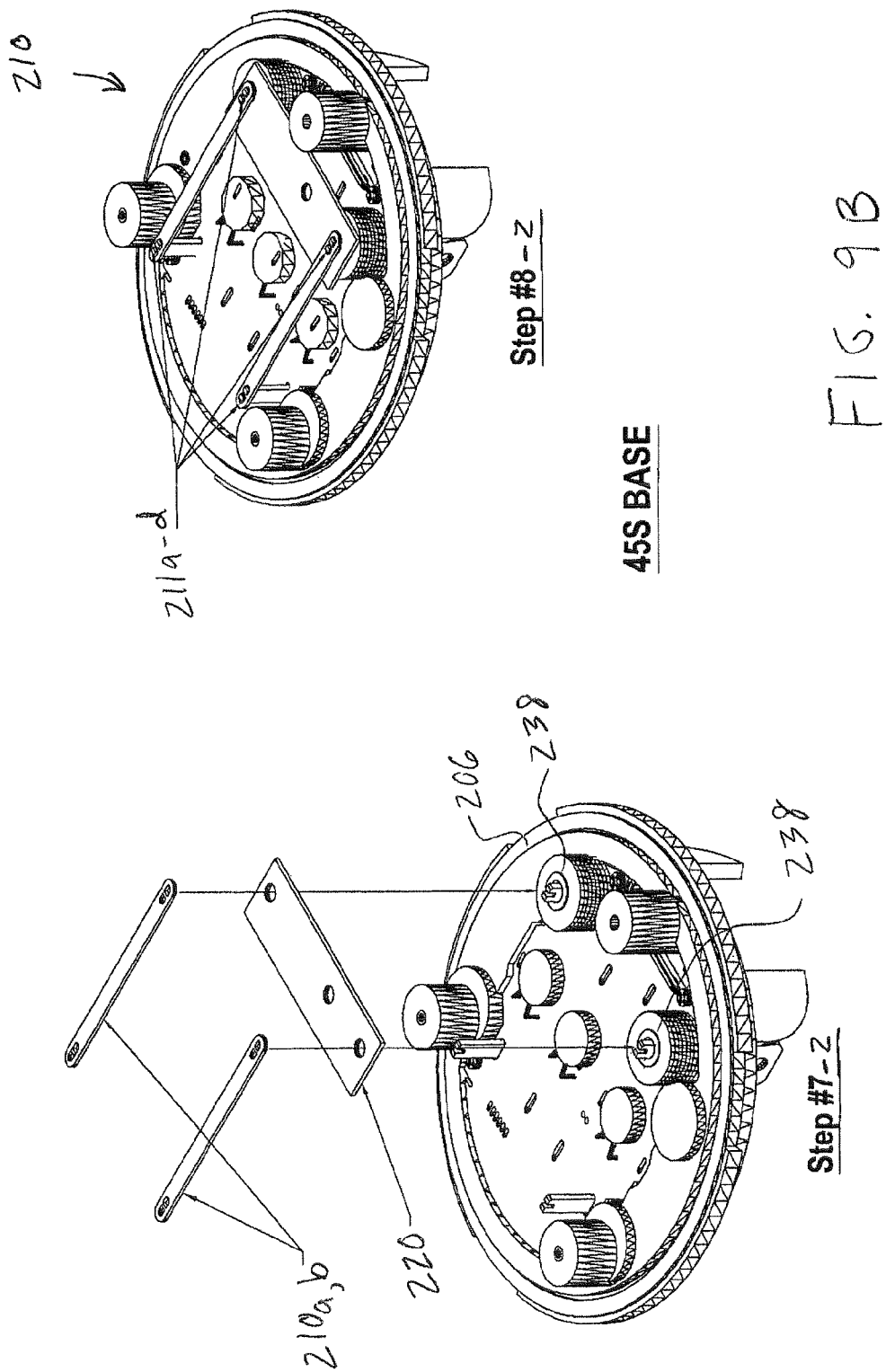

US 8,717,007 B2

INTELLIGENT ELECTRONIC DEVICE HAVING A TERMINAL ASSEMBLY FOR COUPLING TO A METER MOUNTING SOCKET

PRIORITY

This application claims priority to U.S. Provisional Patent Application Ser. No. 61/104,355 filed on Oct. 10, 2008, the contents of which are hereby incorporated by reference in its entirety.

BACKGROUND OF THE INVENTION

1. Field of the Invention

The present disclosure relates generally to intelligent electronic devices (IEDs) for electrical power systems, and more particularly, to an intelligent electronic device having a terminal assembly for coupling the IED, e.g., a revenue meter, to a meter mounting socket.

2. Description of the Related Art

Electric utility companies ("utilities") track electric usage by customers by using power meters, also known as IEDS. These meters track the amount of power consumed at a particular location. These locations range from power substations, to commercial businesses, to residential homes. The electric utility companies use information obtained from the power meter to charge its customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Additional meter forms include switchboard drawout forms, substation panel metering forms, and A-base front wired forms. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., a substation. These power and energy meters are installed in substations to provide a visual display of real-time data and to alarm when problems occur. These problems include limit alarms, breaker control, outages and many other types of events. Conventionally, the visual display includes numerical information and/or an alarm indication, e.g., a LED, on the face of the meter.

SUMMARY OF THE INVENTION

An intelligent electronic device (IED) having a terminal assembly for coupling the IED, e.g., a revenue meter, to a meter mounting socket is provided.

According to one aspect of the present disclosure, an assembly for coupling a meter to an electrical circuit is provided, the assembly including a housing including a generally planar, rigid base, the base including at least one opening; and at least one circuit board having at least one electrically conducting terminal surface mounted thereon, the at least one electrically conducting terminal extending through the at least one opening of the base to mate with at least one matching jaw of a detachable meter mounting device coupled to the electrical circuit.

In another aspect, the at least one electrically conducting terminal includes a generally rectangular stab having a upper portion and a lower portion, the lower portion including a first perpendicularly projecting tab configured to mate with a land of the at least one circuit board. In one aspect, the at least one electrically conducting terminal includes at least one mounting prong extending from the lower portion of the stab and the at least one circuit board includes at least one opening adjacent the land adapted to receive the at least one mounting prong.

In yet another aspect, the at least one electrically conducting terminal includes a second projecting tab centrally located on the generally rectangular stab, the second projecting tab contacts a surface of the base after the at least one electrically conducting terminals extends through the at least one opening of the base and locks the at least one circuit board to the base.

In a further aspect, the at least one circuit board includes at least one electrical connection extending from the land to at least one electrical component. The at least one electrical component is at least one voltage sensor or current sensor.

In another aspect, the assembly further includes at least one second electrically conducting terminal including a generally rectangular stab having a upper portion and a lower portion, the lower portion including a downwardly projecting leg extending through at least one opening in the at least one circuit board and the upper potion extending through the at least one opening of the base to mate with at least one matching jaw of the detachable meter mounting device coupled to the electrical circuit. In one aspect, at least one current sensor is disposed around the downwardly projecting leg.

In still another aspect, the assembly further includes at least one third electrically conducting terminal including a generally rectangular stab having a upper portion and a lower portion, the lower portion including a downwardly projecting leg extending through at least one opening in the at least one circuit board and the upper portion extending through the at least one opening of the base to mate with at least one matching jaw of the detachable meter mounting device coupled to the electrical circuit, wherein the downwardly projecting leg of the at least one second electrically conducting terminal is electrically coupled to the downwardly projecting leg of the at least one third electrically conducting terminal, e.g., by an electrically conducting bar.

According to another aspect of the present disclosure, an electrical meter for sensing electrical parameters from an electric circuit is provided. The electrical meter includes a housing including a generally planar, rigid base, the base including at least one opening; at least one circuit board having at least one first electrically conducting terminal surface mounted thereon, the at least one first electrically conducting terminal extending through the at least one opening of the base to mate with at least one matching jaw of a detachable meter mounting device coupled to the electrical circuit, the at least one circuit board includes at least one electrical connection extending from the at least one first electrically conducting terminal to at least one voltage sensor; at least one second and third electrically conducting terminals, each of the at least one second and third electrically conducting terminals including a generally rectangular stab having a upper portion and a lower portion, the lower portion including a downwardly projecting leg extending through at least one opening in the at least one circuit board and the upper potion extending through the at least one opening of the base to mate with at least one matching jaw of the detachable meter mounting device coupled to the electrical circuit; and at least one current sensor disposed around one of the downwardly projecting legs, wherein the downwardly projecting leg of the at least one second electrically conducting terminal is electrically coupled to the downwardly projecting leg of the at least one third electrically conducting terminal.

In another aspect, the electrical meter further includes at least one digital sampler coupled to each of the current sensor and voltage sensor for sampling the electrical parameters of the electrical circuit; and at least one processor coupled to the at least one digital sampler for calculating power parameters of the electrical circuit.

According to yet another aspect of the present disclosure, a method for manufacturing an electrical meter for sensing electrical parameters from an electrical circuit is provided, the method including providing a generally planar, rigid base, the base including at least one opening; surface mounting at least one electrically conducting terminal to at least one circuit board; and extending through the at least one opening of the base the at least one electrically conducting terminal to mate with at least one matching jaw of a detachable meter mounting device coupled to the electrical circuit.

BRIEF DESCRIPTION OF THE DRAWINGS

The above and other aspects, features, and advantages of the present disclosure will become more apparent in light of the following detailed description when taken in conjunction with the accompanying drawings.

FIGS. 7A and 7B illustrates a method for assembling the terminal assembly in accordance with an embodiment of the present disclosure, where the terminal assembly is used in conjunction with an ANSI 9S/36S form base;

FIGS. 8A-D illustrates a printed circuit board and terminal configuration to be employed in a terminal assembly in accordance with another embodiment of the present disclosure;

FIGS. 9A and 9B illustrates a method for assembling the terminal assembly in accordance with another embodiment of the present disclosure, where the terminal assembly is used in conjunction with an ANSI 45S form base.

Figure 1A:
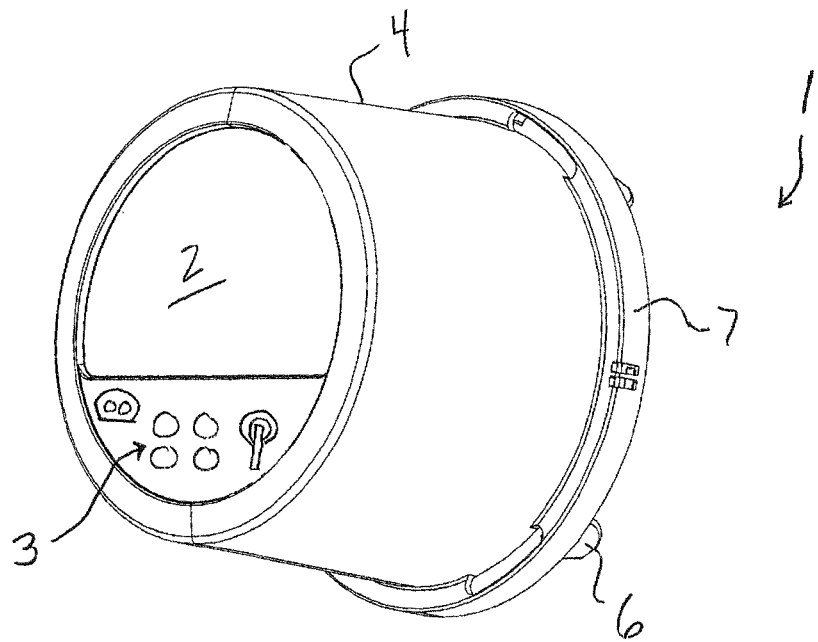
FIG. 1A is a front perspective view of a socket based revenue meter.
Figure 1B:
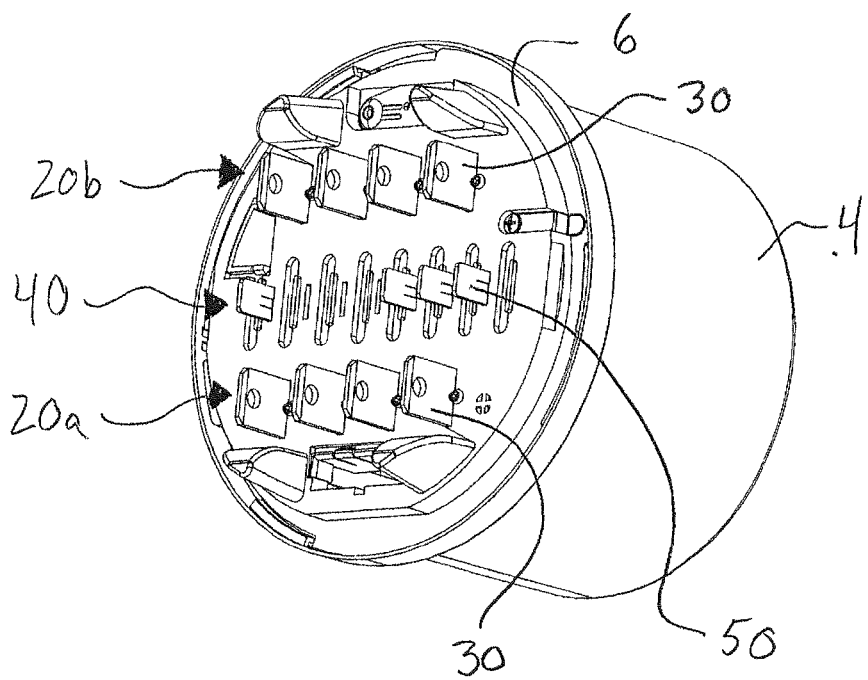
FIG. 1B is a rear perspective view of the socket based revenue meter shown in FIG. 1.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION OF THE PREFERRED EMBODIMENTS

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces, programmable logic or other device or devices.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage, programmable logic or other device or devices.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances. The term "portable" is used in reference to the power quality analyzers to denote transportability of such IEDs and ability thereof for momentarily, temporary, and permanent connectivity to respective electrical services and communication networks.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the quality, distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering. Exemplary intelligent electronic devices are disclosed and described in the following commonly owned U.S. issued patents and published applications: U.S. Pat. No. 7,256,709 entitled "METER WITH IRDA PORT" filed on May 15, 2002; U.S. Patent Application Publication No. 2006/0071813 entitled "METER HAVING A COMMUNICATION INTERFACE FOR RECEIVING AND INTERFACING WITH A COMMUNICATION DEVICE" filed on Oct. 5, 2004; U.S. Patent Application Publication No. 2006/0077999 entitled "SYSTEM AND METHOD FOR SIMULTANEOUS COMMUNICATION ON MODBUS AND DNP 3.0 OVER ETHERNET FOR ELECTRONIC POWER METER" filed on Mar. 23, 2005; U.S. Pat. No. 7,305,310 entitled 'SYSTEM AND METHOD FOR COMPENSATING FOR POTENTIAL AND CURRENT TRANSFORMERS IN ENERGY METERS" filed on Apr. 18, 2005; U.S. Patent Application Publication No. 2006/0161400 entitled "MULTIPLE ETHERNET PORTS ON POWER METER" filed on Jan. 19, 2005; U.S. Pat. No. 7,271,996 entitled "CURRENT INPUTS INTERFACE FOR AN ELECTRICAL DEVICE" filed on Dec. 3, 2004; U.S. Pat. No. 7,388,189 entitled "SYSTEM AND METHOD FOR CONNECTING ELECTRICAL DEVICES USING FIBER OPTIC SERIAL COMMUNICATION" filed on Jan. 24, 2005; U.S. Design Pat. No. D525,893 entitled "ELECTRONIC POWER METER" issued on Aug. 1, 2006; U.S. Pat. No. 7,184,904 entitled "SYSTEM AND METHOD FOR PROVIDING UNIVERSAL ADDITIONAL FUNCTIONALITY FOR POWER METERS" filed on Mar. 28, 2005; U.S. Pat. No. 7,337,081 entitled "METERING DEVICE WITH CONTROL FUNCTIONALITY AND METHOD THEREOF" filed on Jan. 27, 2006; U.S. Design Pat. No. D545,181 entitled "WALL MOUNT ASSEMBLY" filed on Mar. 7, 2005; U.S. Design Pat. No. D526,920 entitled "ELECTRONIC METER" issued on Aug. 22, 2006; U.S. Patent Application Publication No. 2006/0170409 entitled "TEST PULSES FOR ENABLING REVENUE TESTABLE PANEL METERS" filed on Dec. 22, 2005; U.S. Pat. No. 6,735,535 entitled "POWER METER HAVING AN AUTO-CALIBRATION FEATURE AND DATA ACQUISITION CAPABILITIES" issued on May 11, 2004; U.S. Pat. No. 6,636,030 entitled "REVENUE GRADE METER WITH HIGH-SPEED TRANSIENT DETECTION" issued on Oct. 21, 2002; U.S. Pat. No. 6,751,563 entitled "ELECTRONIC POWER METER" issued on Jun. 15, 2004; U.S. Pat. No. 7,155,350 entitled "SYSTEM AND METHOD UTILIZING VIRTUAL SWITCHING FOR ELECTRIC PANEL METERING" filed on Jul. 22, 2004; U.S. Pat. No. 7,294,997 entitled "ELECTRICAL METER INSTALLATION SYSTEM AND METHOD" filed on Jul. 22, 2004; U.S. Patent Application Publication No. 2006/0082355 entitled "TEST PULSES FOR ENABLING REVENUE TESTABLE PANEL METERS" filed on Oct. 20, 2004; U.S. Patent Application Publication No. 2006/0083260 entitled "SYSTEM AND METHOD FOR PROVIDING COMMUNICATION BETWEEN INTELLIGENT ELECTRONIC DEVICES VIA AN OPEN CHANNEL" filed on Oct. 20, 2004; and U.S. Pat. No. 7,304,586 entitled "ON-LINE WEB ACCESSED ENERGY METER" filed on Oct. 20, 2004, the contents of all of which are hereby incorporated by reference in their entireties.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

Referring to the Figures, a socket based revenue meter 1 is provided, also known as an S-base meter. Although the meter shown in FIGS. 1-7B is configured as an ANSI 9S/36S form meter, the teachings of the present disclosure may be applied to other forms of socket based meters such as 45S and the like. The meter 1 includes a plurality of current terminals 30 and voltage terminals 50 disposed on backside of the meter. In the embodiment illustrated, current terminals 30a-30f are disposed in two rows 20a (terminals 30a-30c) and 20b (terminals 30d-30f) of three current terminals each. Four voltage terminals 50a-50d are disposed in single row 40. As will be noted, current terminals 30a-30f feature meter knives or stabs 37a-37f that are substantially larger than meter knives or stabs 56a-56d corresponding to voltage terminals 50a-50d. The larger size of current terminals 30a-30f is required to permit large currents to be sensed accurately thereby. It will be recognized by those skilled in the art that in other embodiments the meter knives or stabs may be used in other arrangements. For example, depending on the form factor, the terminals 30 may be used as voltage terminals. The terminals 30, 50 may be used in any other suitable combination of voltage and current terminals or for other purposes.

The terminals 30, 50 are designed to mate with matching jaws of a detachable meter-mounting device, such as a revenue meter socket. The socket is hard wired to the electrical circuit and is not meant to be removed. A socket-sealing ring 7 is used as a seal between the meter 1 and/or cover 4 and the meter socket to prevent removal of the meter and to indicate tampering with the meter. To install an S-base meter, the utility need only plug in the meter into the socket. This makes installation of new meters and especially replacement of defective meters extremely simple. Once installed, the installer need only secure the sealing ring 7, which ensures that the meter will not be tampered with (as detailed in the ANSI standards). To remove the meter 1, the installer need only pull it out of the socket. The meter includes a cover 4. In an exemplary embodiment, the cover 4 is made of a clear material. The meter 1 also includes a communications port 334, and a graphic user interface 2 which can be accessed through a clear portion 2 of the cover 4, the details of which will be described below in relation to FIG. 10.

Figure 2:
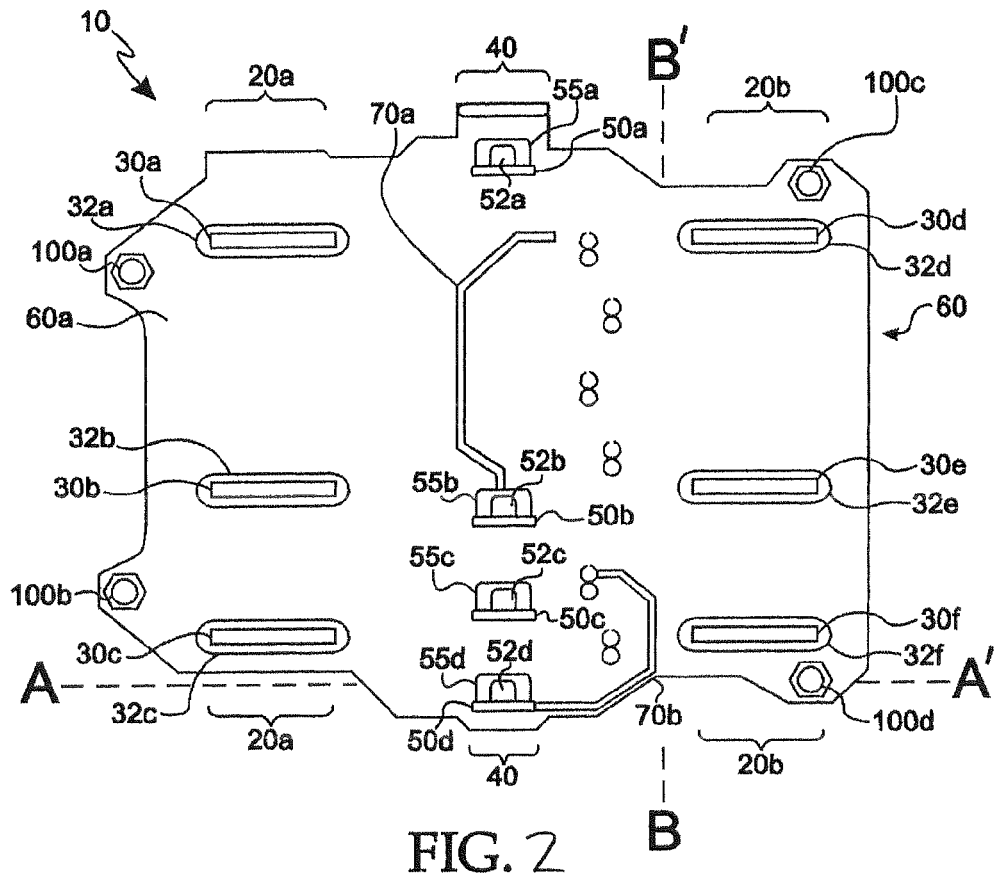
FIG. 2 is a top plan view of a terminal assembly in accordance with an embodiment of present disclosure.
Figure 3:
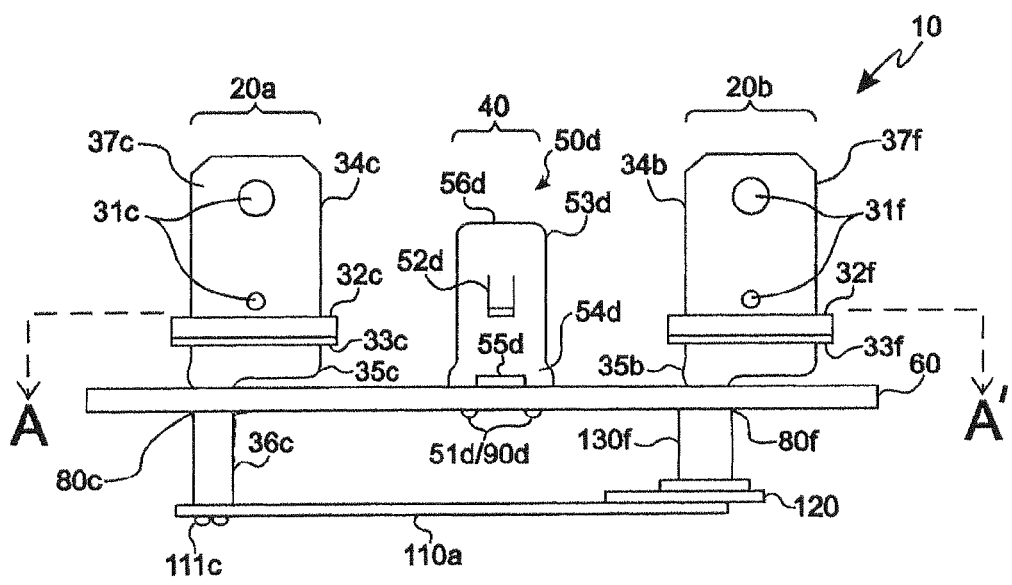
FIG. 3 illustrates a first side view of the terminal assembly.
Figure 4:
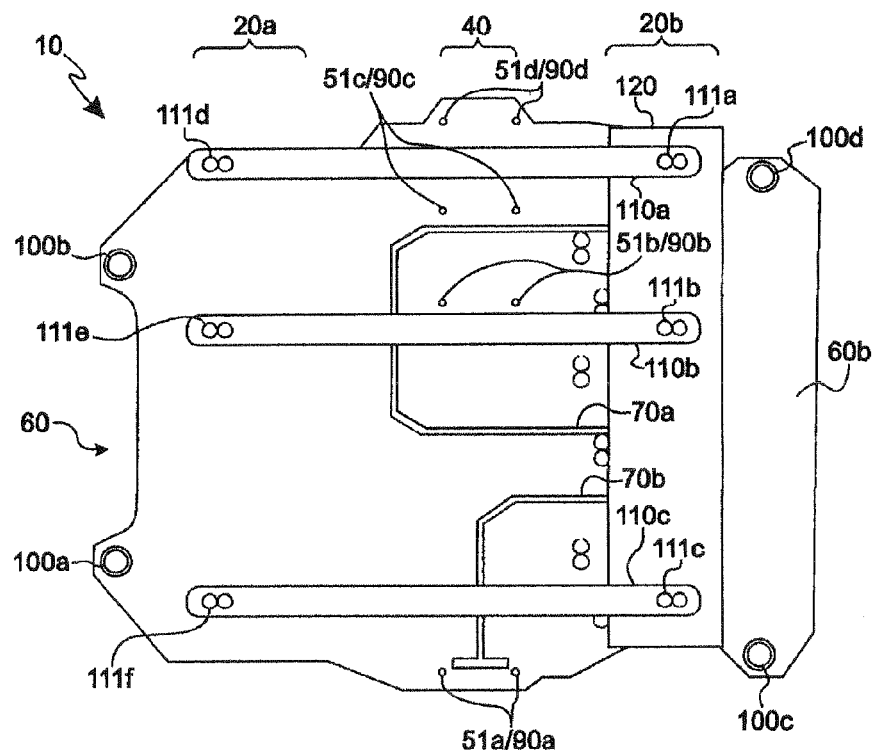
FIG. 4 illustrates a bottom plan view of the terminal assembly.
Figure 5:
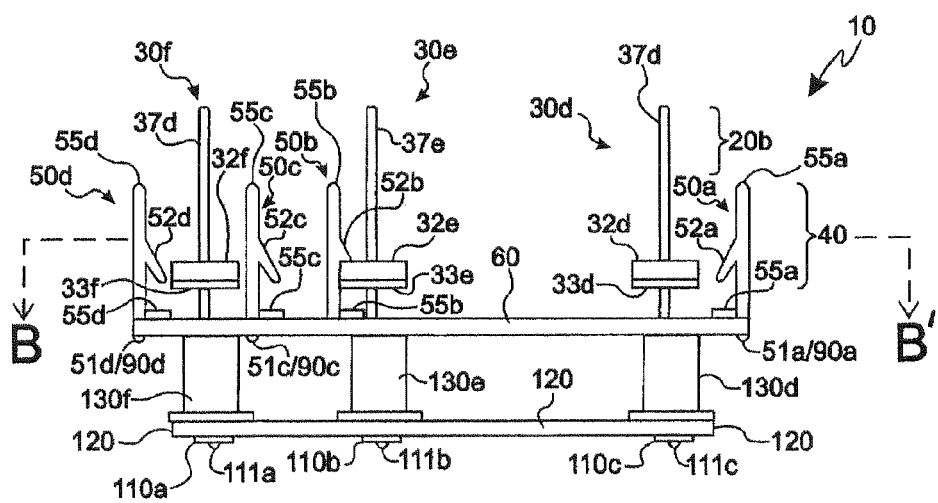
FIG. 5 illustrates a second side view of the terminal assembly.
Figure 6A:
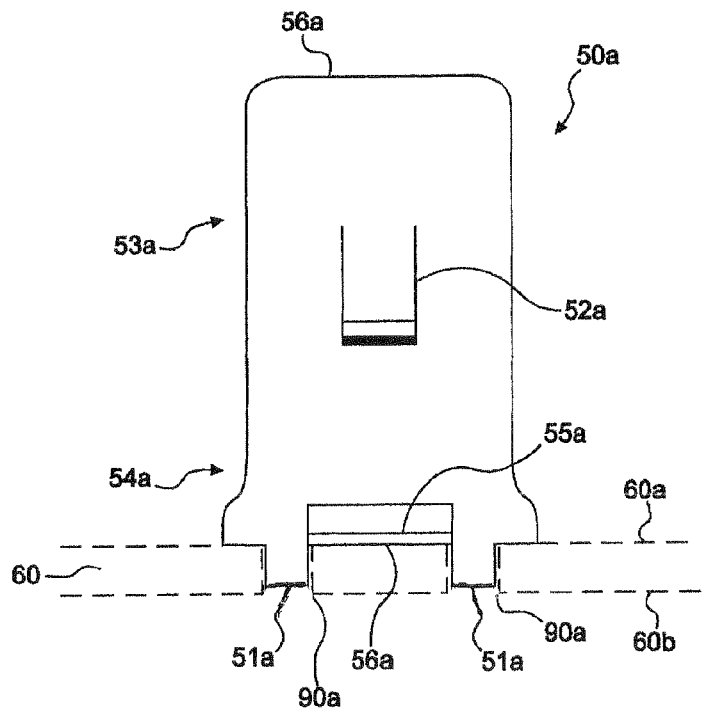
FIG. 6A illustrates a side view of a single terminal and FIGS. 6B and C illustrate the mounting of a terminal to a printed circuit in accordance with one embodiment of the present disclosure.
Figure 6B:
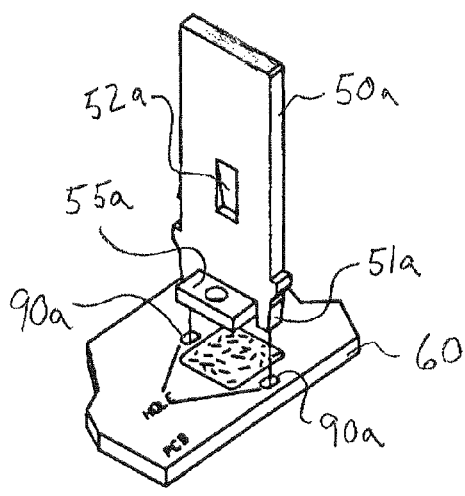
Figure 6C:
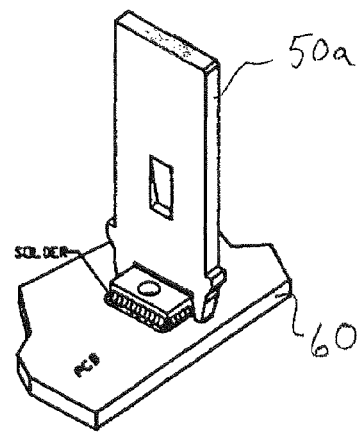

A printed circuit board and terminal assembly (reference numeral 10 in the Figures) designed and configured for use in the revenue meters is provided. Referring to FIGS. 2 through 6, FIG. 2 shows a top plan view of new product or assembly 10, FIG. 3 shows a first side view of assembly 10 through Section A-A' of FIG. 2, FIG. 4 shows a bottom plan view of assembly 10, FIG. 5 shows a second side view of assembly through Section B-B' of FIG. 2, and FIG. 6 shows a side view of a single voltage terminal 50a.

The assembly 10 forms a portion of the revenue meter, and is configured to permit current terminals 30a-30f and voltage terminals 50a-50d thereof to project through a rearward-facing rigid plastic housing and substrate such that meter knives or stabs 37a-37f and 56a-56d of terminals 30a-30f and 50a-50f, respectively, may engage corresponding revenue meter jaws in a revenue meter wall socket. Printed circuit board 60 is configured to accept thereon a number of electrical and electronic components that are discussed below in relation to FIG. 7.

Referring again to FIGS. 2 through 6, assembly 10 comprises printed circuit board 60 formed conventionally of fiberglass and having electrically conductive traces 70a and 70b disposed thereon. Printed circuit board 60 has a plurality of through-holes 80a-80f and 90a-90d formed therein for accepting, respectively, various portions of current terminals 30a-30f, and voltage terminals 50a-50d, therein or therethrough, more about which is said below.

Referring to FIG. 3, current terminals 30a-30f are disposed in two rows 20a (terminals 30a-30c) and 20b (terminals 30d-30f) of three current terminals each. Four voltage terminals 50a-50d are disposed in single row 40. As will be noted, current terminals 30a-30f feature meter knives or stabs 37a-37f that are substantially larger than meter knives or stabs 56a-56d corresponding to voltage terminals 50a-50d. The larger size of current terminals 30a-30f is required to permit large currents to be sensed accurately thereby.

Current terminals 30a-30f each comprise meter knives or stabs 37a-37f, upper portion 34a-34f and lower portion 35a-35f, with the lowermost portion of each terminal forming downwardly projecting leg 36a-36f, each of which is configured to fit through a corresponding through-hole 80a-80f. Note that no solder is disposed in through-holes 80a-80f, and that legs 36a-36f are free to move vertically within through-holes 80a-80f. Holes 31a-31f are formed in terminals 30a-30f.

The lowermost portions of legs 36a-36f comprise two prongs each, which are configured to engage and project through corresponding through-holes disposed in current bars 110a, 110b and 110c. Solder is flowed around such prongs to form solder joints 111a-111f and thereby secure legs 36a-36f to bars 110a-110c. Legs 36d, 36e and 36f of terminals 30d, 30e and 30f project first through through-holes 80d, 80e and 80f and then through electrically insulative sleeves 130d, 130e and 130f and electrically insulative shield 120, where the lowermost prongs thereof engage corresponding holes in bars 110a, 110b and 110c and are soldered thereto. Note that no solder is flowed or projects through the holes disposed in electrically insulative shield 120, and that solder is flowed only onto bars 110a-110c to secure the lowermost prongs of legs 36a-36f thereto. Shield 120 is configured to insulate electrically various electrical and electronic components disposed within the revenue meter from three toroidally-shaped current transformers mounted in relatively close proximity to shield 120 on printed circuit board 60 (see FIGS. 3-5).

Continuing to refer to FIGS. 2-6, and with particular reference to FIG. 6, voltage terminals 50a-50d comprise meter knives or stabs 56a-56d, lower portions 54a-54d, upper portions 53a-53d, mounting prongs 51a-51d, and horizontally-projecting tabs 55a-55d configured to engage corresponding revenue meter jaws in a revenue meter wall socket. Mounting prongs 51a-51d are configured to be inserted to corresponding small through-holes 90a-90d disposed in printed circuit board 60. Note that no solder is disposed in through-holes 90a-90d when voltage terminals 50a-50 are attached thereto. Instead, mounting prongs 51a-51d accurately align voltage terminals 50a-50d in respect of printed circuit board 60 before horizontally-projecting tabs 55a-55d are soldered to corresponding portions of top surface 60a by solder 56a, e.g., a land, pad, etc. Note that in the assembly 10 no solder extends between top surface 60a and bottom surface 60b of printed circuit board 60 through any of through-holes 80a-80f or 90a-90d. Indeed, no solder is disposed inside or between any portions of through-holes 80a-80f or 90a-90d, or even directly above or below such through-holes.

Assembly 10 does not employ solder extending between top side 60a and bottom side 60b of printed circuit board 60 through gaps disposed between the terminals and the through-holes, or through vias disposed around the through-holes, as a means of mechanically affixing terminals 30a-30f and 50a-50d sufficiently rigidly to printed circuit board 60 to permit revenue meter insertion and extraction forces to be borne thereby. Instead, assembly 10 accomplishes this function in a completely different way by surface mounting voltage terminals 50a-50d to printed circuit board 60 by means of solder disposed only on top side 60a beneath horizontally-projecting tabs 55a-55d and unsoldered mounting pins 51a-51d disposed in unsoldered through-holes 90a-90d, and by affixing current terminals 30a-30f to mounting bars 110a-110c by means of solder attaching mounting bars 110a-110c to prongs disposed on the lowermost portions of legs 36a-36f. It is to be appreciated that in one embodiment the projecting tabs 52a-d centrally located on the voltage terminals 50a-d will come into contact with the external surface of the base after the voltage terminals pass through the opening in the base locking the circuit board to the base.

Figure 7B:
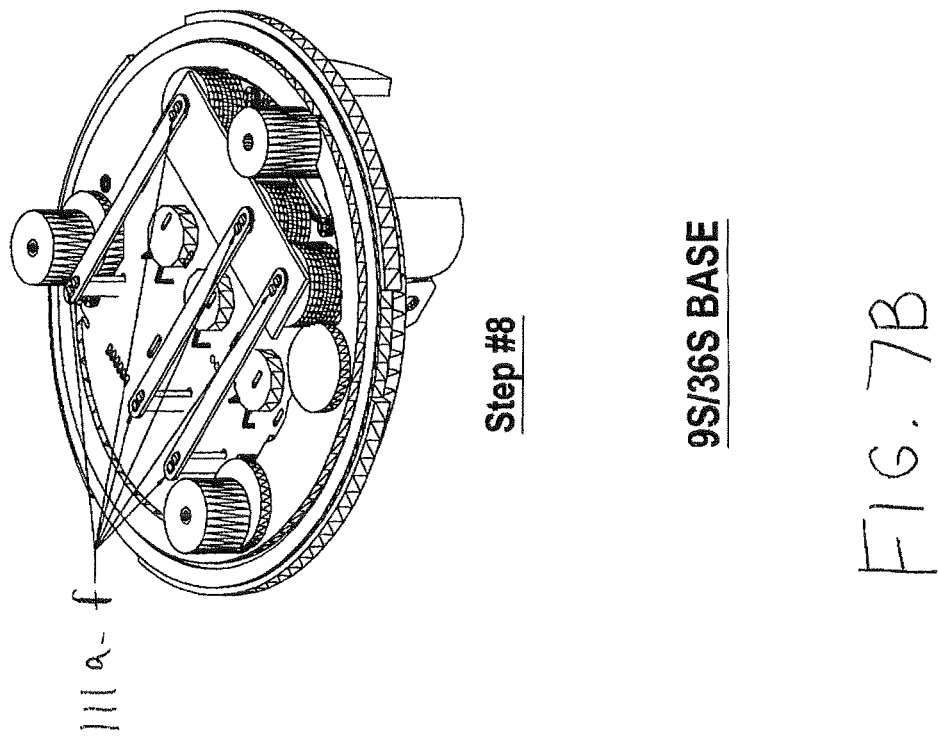
Figure 7B:
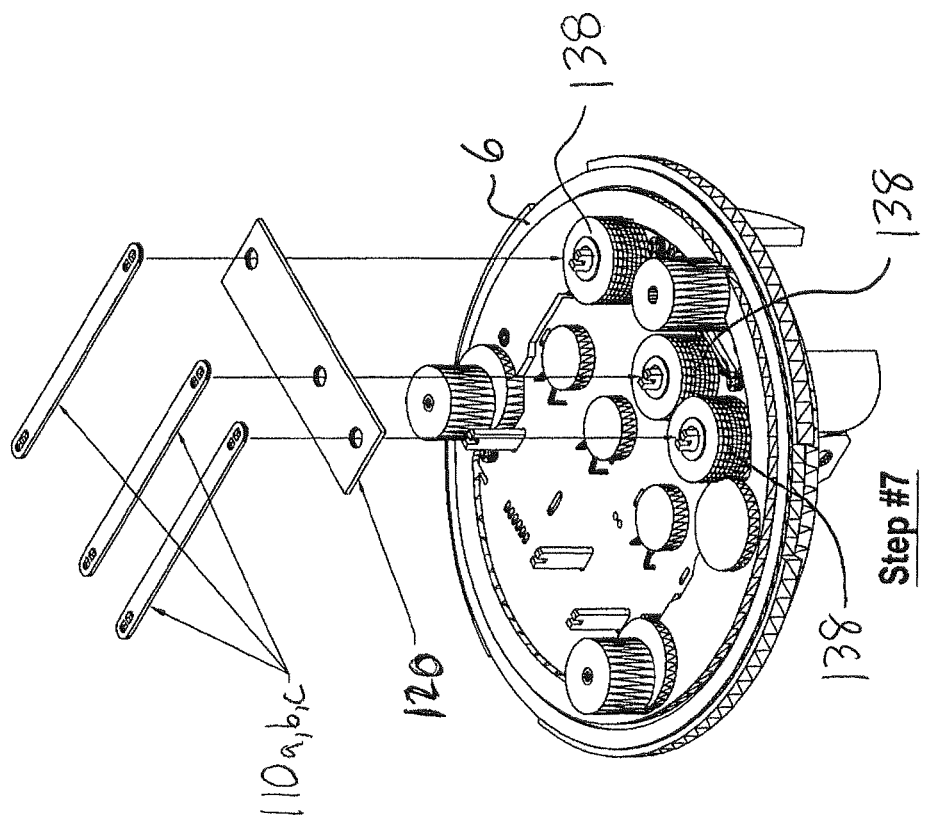

Referring to FIGS. 7A and 7B, a method for assembling the terminal assembly 10 is illustrated. In step 1, current terminals 30a-f are inserted into through-hole 80a-f of printed circuit board 60 and voltage terminals 50 a-d are inserted in through-holes 90a-d. Next, in step 2, upper gasket 122 and lower gasket 124 are provided on certain current terminals 30 and upper gasket 126 and lower gasket 128 are provided on certain voltage terminals.

In step 3, the printed circuit board 60 in inverted and coupled to base 6. The base 6 includes a plurality of corresponding holes 130 for accepting the current terminals 30a-f and voltage terminals 50a-d. Spacers 132 are disposed on the base 6 for supporting subsequent printed circuit board(s) to complete the meter, the details of which will not be described here. In step 4, the current and voltage terminals are inserted into the plurality of holes 130 until the tab 52a-d of the voltage terminals 50a-d passes to the other side of the printed circuit board 60 and locks the printed circuit board 60 to the base 6, where step 4 shows the underside of the base 6. Cotter pins 134 are inserted into the lower holes 31a-f of the current terminals to secure the current terminals in the assembly 10.

Once the cotter pins are inserted, the tabs 52a-d are bent to lock the printed circuit board to the base 6.

In step 5, an input power board 136 is provided for supporting at least three current sensors 138. The current sensors 138 will be disposed around legs 36a-c of current terminals 30a-c. Input power board 136 will further include holes 140 for receiving legs 36d-f of current terminals 30d-f. Step 6 illustrates the input power board 136 mounted on base 6.

In step 7 of FIG. 7B, bars 110a-c are provided for completing the current measuring circuit between legs of corresponding current terminals. The lowermost portions of legs 36a-36f comprise two prongs each, which are configured to engage and project through corresponding through-holes disposed in current bars 110a, 110b and 110c. In step 8, solder is flowed around such prongs to form solder joints 111a-111f and thereby secure legs 36a-36f to bars 110a-110c. Note that no solder is flowed or projects through the holes disposed in electrically insulative shield 120, and that solder is flowed only onto bars 110a-110c to secure the lowermost prongs of legs 36a-36f thereto. Shield 120 is configured to shield electrically various electrical and electronic components disposed within the revenue meter from three toroidally-shaped current transformers 138 mounted in relatively close proximity to shield 120 on printed circuit board 60.

By utilizing the above described techniques, a terminal assembly 10 for a socket based meter will have a large connection surface area for mounting components providing a more reliable terminal to board solder connection. The techniques of the present disclosure will provide, among many other benefits, for more precise positioning of terminals, a more durable mechanical design with better inspectability. Furthermore, the assembly 10 requires no wiring, results in a low profile and has good insulation properties.

Referring to FIGS. 8A-8D, a printed circuit board and terminal configuration in accordance with another embodiment of the present disclosure is illustrated. The printed circuit board 260 and terminals 285 shown in FIG. 8 is to be employed in an ANSI 45S form base, however, the techniques illustrated may be employed in other configuration and embodiments. Similar to the voltage terminals described above in relation to FIGS. 6A-C, the terminals 285 are mounted to the printed circuit board 260 using surface mount technology.

Terminals 285 comprise meter knives or stabs 256, lower portions 254, upper portions 253 and mounting prongs 251 and horizontally-projecting tabs 255. It is to be appreciated the terminals 285 are configured to engage corresponding revenue meter jaws in a revenue meter wall socket. Mounting prongs 251 are configured to be inserted to corresponding small through-holes 290 disposed in printed circuit board 260. Note that no solder is disposed in through-holes 290 when terminals 285 are attached thereto. Instead, mounting prongs 251 accurately align the terminals 285 in respect of printed circuit board 260 before horizontally-projecting tabs 255 are soldered to corresponding portions of a surface of the printed circuit board 260 by solder, e.g., a land, pad, etc. Note that in the assembly no solder extends between top surface and bottom surface of printed circuit board 260 through any of through-holes 290.

Figure 9A:
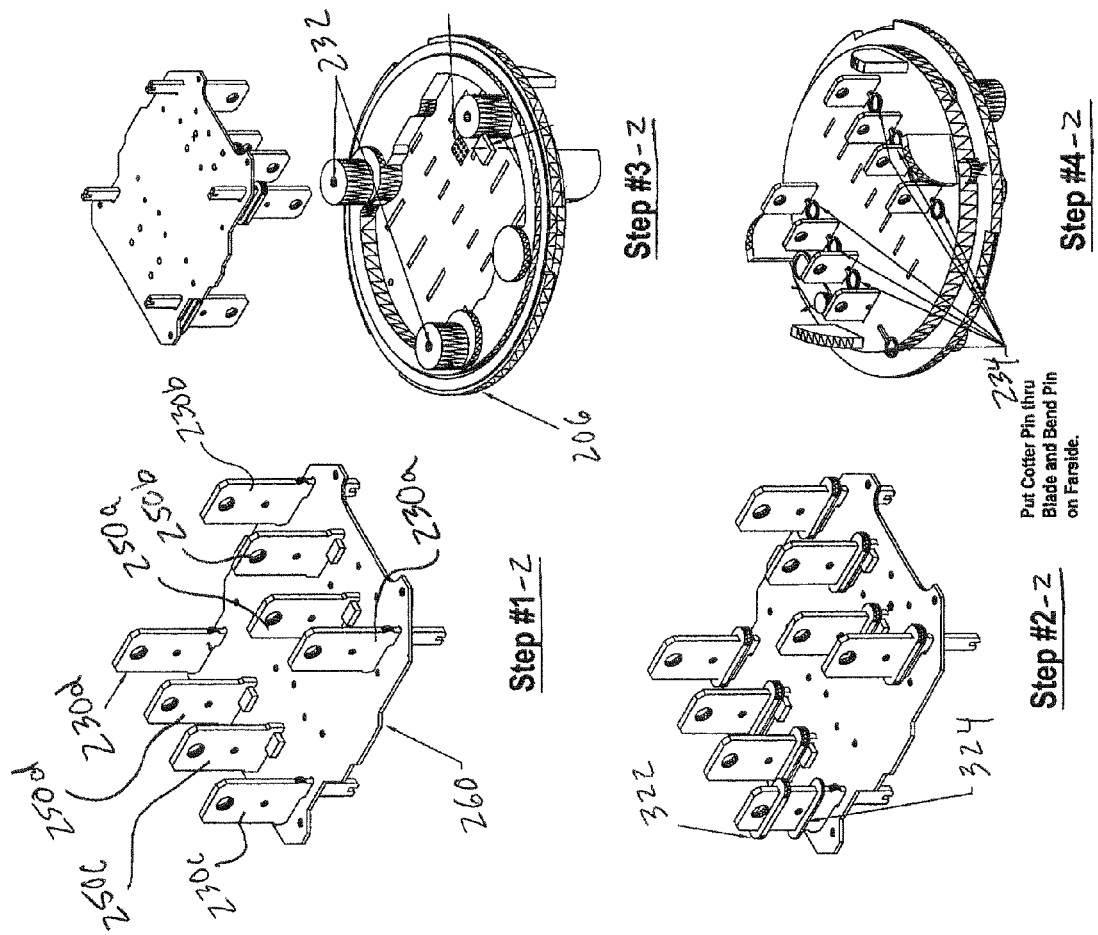

Referring to FIGS. 9A and 9B, a method for assembling the terminal assembly 210 for a ANSI 45S form base is illustrated. It is to be appreciated in this embodiment that the meter knife or stab portion of the terminals are all the same size. Referring to FIG. 9A, the terminals are arranged in two rows with the current terminals 230a-d arranged on the corners of the printed circuit board 260 and the voltage terminals 250a-d are arranged in the inner four positions. Step 1-2 thorough step 8-2 for assembling the assembly 210 are similar to those described above in relation to FIGS. 7A and 7B for assembly 10 and will not be repeated here.

Figure 10:
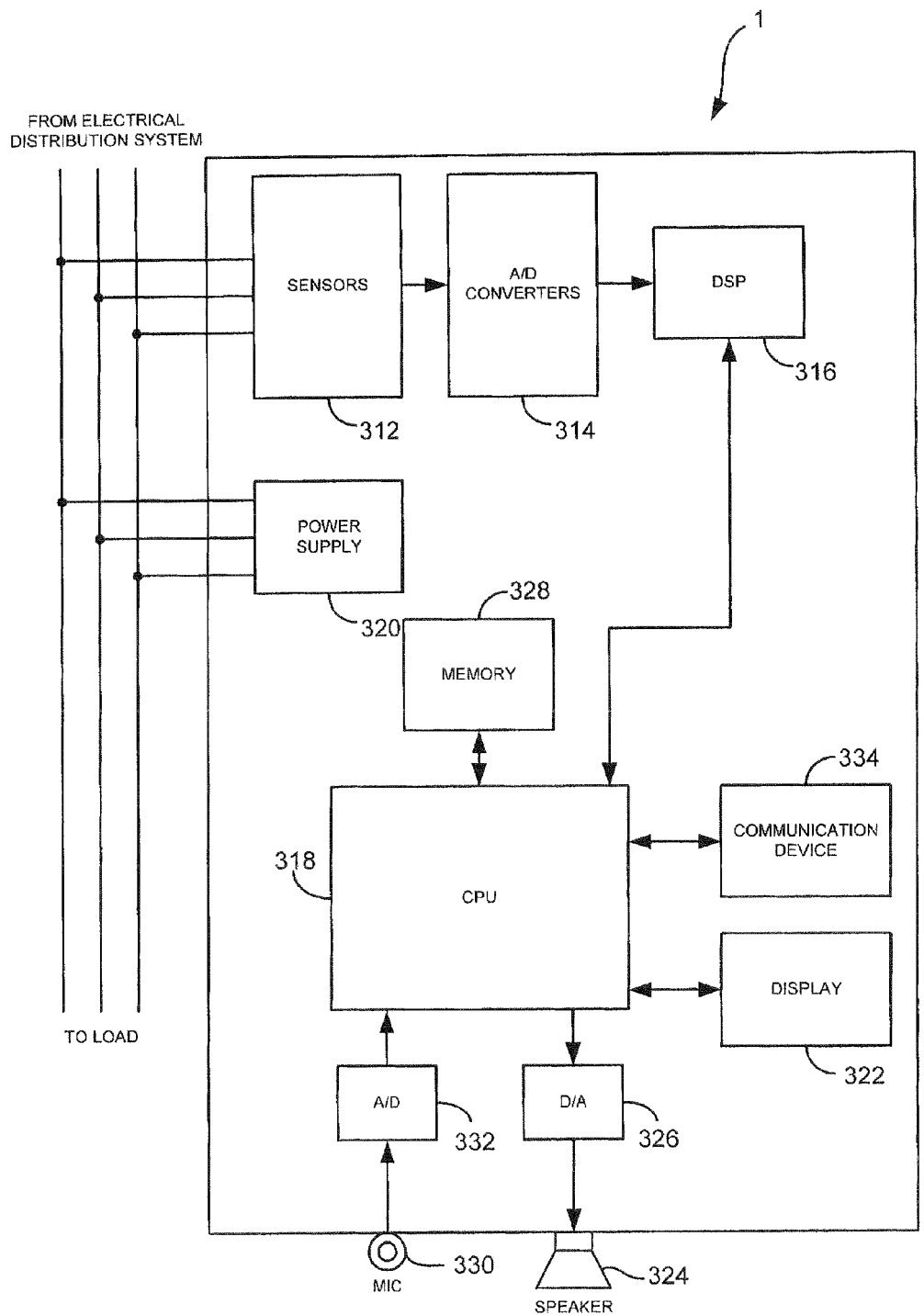
FIG. 10 is a diagram of an intelligent electronic device in accordance with an embodiment of the present disclosure.

System components for an intelligent electronic device (IED) 1 for monitoring and determining an amount of electrical power usage by a consumer and for providing audible and visual indications to a user is illustrated in FIG. 10. Generally, the IED 1 includes sensors 312, a plurality of analog-to-digital (A/D) converters 314 and a processing system including a central processing unit (CPU) 318 and/or a digital signal processor (DSP) 316.

The sensors 312 will sense electrical parameters, e.g., voltage and current, of the incoming lines from an electrical power distribution system, e.g., an electrical circuit. Preferably, the sensors will include current transformers and potential transformers, wherein one current transformer and one voltage transformer will be coupled to each phase of the incoming power lines. A primary winding of each transformer will be coupled to the incoming power lines via the appropriate current or voltage terminal 30,50 and a secondary winding of each transformer will output a voltage representative of the sensed voltage and current to a digital sampler such as analog-to-digital (A/D) converter 314.

An exemplary current sensor is provided as toroidally-shaped current transformer 138 as shown in FIGS. 7A and 7B.

The CPU 318 is configured for receiving the digital signals from the A/D converters 314 to perform the necessary calculations to determine the power usage and controlling the overall operations of the IED 10. In another embodiment, the DSP 316 will receive the digital signals from the A/D converters 314 and perform the necessary calculations to determine the power usage to free the resources of the CPU 318. It is to be appreciated that in certain embodiments the CPU 318 may perform all the functions performed by the CPU 218 and DSP 316, and therefore, in these embodiments the DSP 316 will not be utilized.

A power supply 320 is also provided for providing power to each component of the IED 1. In one embodiment, the power supply 320 is a transformer with its primary windings coupled to the incoming power distribution lines and having an appropriate number of windings to provide a nominal voltage, e.g., 5VDC, at its secondary windings. In other embodiments, power is supplied from an independent source to the power supply 320, e.g., from a different electrical circuit, a uninterruptible power supply (UPS), etc.

The IED 1 of the present disclosure will have user interface for interacting with a user and for communicating events, alarms and instructions to the user. The user interface will include a display 322 for providing visual indications to the user. The display 322 may include a touch screen, a liquid crystal display (LCD), a plurality of LED number segments, individual light bulbs or any combination of these. The display 322 may provide the information to the user in the form of alpha-numeric lines, computer-generated graphics, videos, etc. Visual information provided on the display 322 may include but is not limited to instructional videos, operating manuals associated with an IED, a flowchart for troubleshooting, a checklist for troubleshooting, etc. Digital files including the various visual instructions are stored in either memory 328 or retrieved from a remote event server. An exemplary multi-media graphic user interface is disclosed and described in commonly owned co-pending U.S. application Ser. No. 11/589,381, entitled "POWER METER HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The user interface will also include an audible output device 324, e.g., a speaker. The speaker 324 will be coupled to the CPU 318 via a digital-to-analog converter (D/A) 326 for converting digital audio files stored in memory 328 to analog signals playable by the speaker 322. The audible output device 324 may simply provide audible instructions to a user when an event is detected or may provided audio with a corresponding video being displayed on the display 322.

The device 1 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The memory 328 is configured for storing the files including the visual and/or audible instructions. The memory 328 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, Smart-Media card, MultiMediaCard (MMC), SD (Secure Digital) memory; or any other memory storage that exists currently or will exist in the future. By utilizing removable memory, an IED can be easily upgraded with new instruction files as needed.

In one embodiment, the digital audio files may be programmed directly through the IED 1. In this embodiment, the IED 1 will include an audio input device 330, e.g., a microphone, for receiving spoken words in the form of analog signals. The analog signals will then be sent to an analog-to-digital converter (A/D) 332 to convert the analog signals into digital signals understandable by the CPU 318. The CPU 318 will then store the recorded digital audio file in the memory 328. The user may associate the recorded digital file with a particular alarm through the touch screen display 322. Alternatively, the user may associate the recorded digital file with an event code.

In a further embodiment, the IED 1 will include a communication device 334 for enabling communications between the IED 1 and other computing devices, e.g., a desktop computer, laptop computer, other IEDs, etc. The communication device 334 may be a modem, network interface card (NIC), wireless transceiver, etc. The communication device 334 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data. The IED will communicate using the various protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. In other embodiments, the IED will communicate using any one of various electronic mail (e-mail) protocols.

In a further embodiment, microphone 330 and speaker 324 are further coupled to the communication device 334 for enabling voice communication from the IED to a remote location. In one embodiment, the communication device 334 will enable voice communications with VoIP (Voice over Internet Protocol) or may include a mobile communications module operating on CDMA, PCS, GSM or any other known wireless communication technology.

It is to be appreciated that the communication device 334 may include a single integrated circuit chip to perform data transfer and voice communications or a single module including a separate data transfer chip, e.g., a WiFi transceiver, and a separate voice communication chip, e.g., a CDMA chip. In one embodiment, the communication device 334 will operate on the wireless GPRS (General Packet Radio Service) data protocol or a 3G protocol such as W-CDMA, CDMA2000 and TD-SCDMA. Both the GPRS and 3G protocols have the ability to carry both voice and data over the same service.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An assembly for coupling a meter to an electrical circuit, the assembly comprising:
    a generally planar, rigid base, the base including at least one opening;
    at least one circuit board having a surface;
    at least one electrically conducting terminal mounted on the surface of the at least one circuit board, the at least one electrically conducting terminal extending through the at least one opening of the base to mate with at least one matching jaw of a detachable meter mounting device coupled to the electrical circuit;
    at least one second electrically conducting terminal including a generally rectangular stab having a distal portion and a proximal portion, the proximal portion including an electrically conductive, proximally projecting leg extending through at least one opening in the at least one circuit board and the distal portion extending through the at least one opening of the base to mate with at least one matching jaw of the detachable meter mounting device coupled to the electrical circuit; and
    at least one current sensor disposed around the proximally projecting leg.

2. The assembly as in claim 1, wherein the at least one electrically conducting terminal includes a generally rectangular stab having a distal portion and a proximal portion, the proximal portion including a first perpendicularly projecting tab configured to mate with a land of the at least one circuit board.

3. The assembly as in claim 2, wherein the at least one electrically conducting terminal includes at least one mounting prong extending from the proximal portion of the stab and the at least one circuit board includes at least one opening adjacent the land adapted to receive the at least one mounting prong.

4. The assembly as in claim 3, wherein the at least one electrically conducting terminal includes a second projecting tab centrally located on the generally rectangular stab, the second projecting tab contacts a surface of the base after the at least one electrically conducting terminals extends through the at least one opening of the base and locks the at least one circuit board to the base.

5. The assembly as in claim 4, wherein the at least one circuit board includes at least one electrical connection extending from the land to at least one electrical component.

6. The assembly as in claim 5, wherein the at least one electrical component is at least one voltage sensor.

7. The assembly as in claim 1, further comprising at least one third electrically conducting terminal including a generally rectangular stab having a distal portion and a proximal portion, the proximal portion including a proximally projecting leg extending through at least one opening in the at least one circuit board and the distal portion extending through the at least one opening of the base to mate with at least one matching jaw of the detachable meter mounting device coupled to the electrical circuit, wherein the proximally projecting leg of the at least one second electrically conducting terminal is electrically coupled to the proximally projecting leg of the at least one third electrically conducting terminal.

8. The assembly as in claim 7, wherein the proximally projecting legs of the at least one second and third electrically conducting terminals are coupled by an electrically conducting bar.

9. The assembly as in claim 8, wherein the at least one electrically conducting terminal includes a generally rectangular stab having a distal portion and a proximal portion, the proximal portion including a first perpendicularly projecting tab configured to mate with a land of the at least one circuit board, the at least one circuit board includes at least one electrical connection extending from the land to at least one voltage sensor.

10. An electrical meter for sensing electrical parameters from an electric circuit, the meter comprising:
    a housing;
    a generally planar, rigid base, the base including at least one opening;
    at least one circuit board having a surface;
    at least one first electrically conducting terminal mounted on the surface of the at least one circuit board, the at least one first electrically conducting terminal extending through the at least one opening of the base to mate with at least one matching jaw of a detachable meter mounting device coupled to the electrical circuit;
    at least one electrical connection extending from the at least one first electrically conducting terminal to at least one voltage sensor;
    at least one second and third electrically conducting terminals, each of the at least one second and third electrically conducting terminals including a generally rectangular stab having a distal portion and a proximal portion, the proximal portion including an electrically conductive, proximally projecting leg extending through at least one opening in the at least one circuit board and the distal portion extending through the at least one opening of the base to mate with at least one matching jaw of the detachable meter mounting device coupled to the electrical circuit; and
    at least one current sensor disposed around one of the proximally projecting legs, wherein the proximally projecting leg of the at least one second electrically conducting terminal is electrically coupled to the proximally projecting leg of the at least one third electrically conducting terminal.

11. The electrical meter as in claim 10, further comprising:
    at least one digital sampler coupled to each of the at least one current sensor and the at least one voltage sensor for sampling the electrical parameters of the electrical circuit; and
    at least one processor coupled to the at least one digital sampler for calculating power parameters of the electrical circuit.

12. The electrical meter as in claim 11, further comprising a display mounted on the housing for displaying at least one sampled electrical parameter or power parameter.

13. The electrical meter as in claim 12, wherein the display is a multi-media graphic user interface.

14. The electrical meter as in claim 12, further comprising a cover configured to be disposed over the housing and mate with the meter mounting device.

15. The electrical meter as in claim 14, wherein the cover is configured to allow access to the display without removing the cover.

16. The electrical meter as in claim 14, further comprising a seal for securing the cover to the meter mounting device and operative to prevent removal of the meter and indicate tampering with the meter.

17. The electrical meter as in claim 14, further comprising a communication device for enabling communications with at least one other device.

18. The electrical meter as in claim 1, further comprising a communication device for enabling communications with at least one other device.

19. The electrical meter as in claim 18, wherein the communication device communicates using Transmission Control Protocol/Internet Protocol (TCP/IP).

20. The electrical meter as in claim 18, wherein the communication device communicates using File Transfer Protocol (FTP).

21. The electrical meter as in claim 18, wherein the communication device communicates using Hypertext Transfer Protocol (HTTP).

22. The electrical meter as in claim 18, wherein the communication device communicates using an electronic mail (e-mail) protocol.

23. The electrical meter as in claim 18, wherein the communication device communicates using a wireless transmission protocol.

24. The electrical meter as in claim 18, wherein the communication device communicates using wireless GPRS (General Packet Radio Service) data protocol.

25. The electrical meter as in claim 18, wherein the communication device communicates using a wireless 3G protocol.

26. The electrical meter as in claim 10, wherein the at least one first electrically conducting terminal includes a generally rectangular stab having a distal portion and a proximal portion, the proximal portion including a first perpendicularly projecting tab configured to mate with a land of the at least one circuit board.

27. The electrical meter as in claim 26, wherein the at least one first electrically conducting terminal includes at least one mounting prong extending from the proximal portion of the stab and the at least one circuit board includes at least one opening adjacent the land adapted to receive the at least one mounting prong.

28. The electrical meter as in claim 27, wherein the at least one first electrically conducting terminal includes a second projecting tab centrally located on the generally rectangular stab, the second projecting tab contacts a surface of the base after the at least one first electrically conducting terminals extends through the at least one opening of the base and locks the at least one circuit board to the base.

29. The electrical meter as in claim 10, wherein the proximally projecting legs of the at least one second and third electrically conducting terminals are coupled by an electrically conducting bar.

30. A method for manufacturing an electrical meter for sensing electrical parameters from an electrical circuit, the method comprising:
  providing a generally planar, rigid base, the base including at least one opening;
  providing at least one circuit board having a surface;
  mounting at least one electrically conducting terminal on the surface of the at least one circuit board;
  providing at least one second electrically conducting terminal including a generally rectangular stab having a distal portion and a proximal portion, the proximal portion including an electrically conductive, proximally projecting leg;
  extending the proximally projecting leg through at least one opening in the at least one circuit board;
  mounting the at least one circuit board to the base, wherein the at least one electrically conducting terminal extends through at least one opening of the base to mate with at least one matching jaw of a detachable meter mounting device coupled to the electrical circuit and the distal portion of the at least one second electrically conducting terminal extends through at least another opening of the base to mate with at least one matching jaw of the detachable meter mounting device coupled to the electrical circuit; and
  disposing at least one current sensor around the proximally projecting leg.

31. The method as in claim 30, wherein the at least one electrically conducting terminal includes a generally rectangular stab having a distal portion and a proximal portion, the proximal portion including a first perpendicularly projecting tab configured to mate with a land of the at least one circuit board.

32. The method as in claim 31, wherein the at least one electrically conducting terminal includes at least one mounting prong extending from the proximal portion of the stab and the at least one circuit board includes at least one opening adjacent the land configured to receive the at least one mounting prong.

33. The method as in claim 32, wherein the at least one electrically conducting terminal includes a second projecting tab centrally located on the generally rectangular stab, the second projecting tab contacts a surface of the base after the at least one electrically conducting terminal extends through the at least one opening of the base and locks the at least one circuit board to the base.

34. The method as in claim 33, wherein the at least one circuit board includes at least one electrical connection extending from the land to at least one electrical component.

35. The method as in claim 34, wherein the at least one electrical component is at least one voltage sensor.

36. The method as in claim 30, further comprising:
  providing at least one third electrically conducting terminal including a generally rectangular stab having a distal portion and a proximal portion, the proximal portion including a proximally projecting leg extending through at least one opening in the at least one circuit board and the distal portion extending through the at least one opening of the base to mate with at least one matching jaw of the detachable meter mounting device coupled to the electrical circuit; and
  electrically coupling the proximally projecting leg of the at least one second electrically conducting terminal to the proximally projecting leg of the at least one third electrically conducting terminal.

37. The method as in claim 36, wherein the proximally projecting legs of the at least one second and third electrically conducting terminals are coupled by an electrically conducting bar.

38. The method as in claim 37, wherein the at least one electrically conducting terminal includes a generally rectangular stab having a distal portion and a proximal portion, the proximal portion including a first perpendicularly projecting tab configured to mate with a land of the at least one circuit board, the at least one circuit board includes at least one electrical connection extending from the land to at least one voltage sensor.

39. An assembly for coupling an electrical meter to an electrical circuit, the assembly comprising:
  a generally planar, rigid base, the base including at least one opening;
  at least one circuit board having a surface; and
  at least one electrically conducting terminal mounted on the surface of the at least one circuit board, the at least one electrically conducting terminal includes a generally rectangular stab having a distal portion and a proximal portion, the proximal portion including a first perpendicularly projecting tab configured to mate with a land of the at least one circuit board and at least one mounting prong extending from the proximal portion of the stab configured to be inserted into at least one opening adjacent the land of the at least one circuit board, the distal portion extending through the at least one opening of the base to mate with at least one matching jaw of a detachable meter mounting device coupled to the electrical circuit.

40. The assembly as in claim 39, wherein the at least one electrically conducting terminal includes a second projecting tab centrally located on the generally rectangular stab, the second projecting tab contacts a surface of the base after the at least one electrically conducting terminals extends through the at least one opening of the base and locks the at least one circuit board to the base.

41. The assembly as in claim 39, wherein the at least one circuit board includes at least one electrical connection extending from the land to at least one electrical component.

42. The assembly as in claim 39, wherein the at least one electrical component is at least one voltage sensor.

43. The assembly as in claim 39, wherein the at least one electrical component is at least one current sensor.

* * * * *